(12) United States Patent
Yamazaki

(10) Patent No.: US 7,906,998 B2
(45) Date of Patent: Mar. 15, 2011

(54) CHARGE PUMPING CIRCUIT AND CLOCK GENERATOR

(75) Inventor: Yoshikazu Yamazaki, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/561,239

(22) Filed: Sep. 16, 2009

(65) Prior Publication Data

US 2010/0097126 A1   Apr. 22, 2010

(30) Foreign Application Priority Data

Oct. 22, 2008  (JP) ................. 2008-272352

(51) Int. Cl.
*H03L 7/06* (2006.01)
(52) U.S. Cl. ........................ 327/157; 327/148
(58) Field of Classification Search ............ 327/148, 327/157
See application file for complete search history.

(56) References Cited

U.S. PATENT DOCUMENTS

| | | | |
|---|---|---|---|
| 6,054,882 A | 4/2000 | Izumikawa | |
| 6,822,520 B2 | 11/2004 | Ramet et al. | |
| 7,427,900 B2 * | 9/2008 | Manetakis et al. | 331/17 |
| 7,521,971 B2 | 4/2009 | Yamazaki | |
| 7,701,271 B1 * | 4/2010 | Sanielevici et al. | 327/157 |
| 2005/0099215 A1 * | 5/2005 | Hsu et al. | 327/157 |
| 2005/0237091 A1 * | 10/2005 | Lindner et al. | 327/157 |
| 2007/0090863 A1 * | 4/2007 | Hsu | 327/157 |
| 2008/0157834 A1 * | 7/2008 | Lin | 327/157 |

FOREIGN PATENT DOCUMENTS

| | | |
|---|---|---|
| JP | 11-88159 A | 3/1999 |
| JP | 2000-224034 A | 8/2000 |
| JP | 2004-517544 | 6/2004 |
| JP | 2006-270225 A | 10/2006 |

OTHER PUBLICATIONS

Yoshikazu Yamazaki, U.S. Appl. No. 12/560,395, filed Sep. 15, 2009.

\* cited by examiner

*Primary Examiner* — Tuan Lam
(74) *Attorney, Agent, or Firm* — Fitzpatrick, Cella, Harper & Scinto

(57) ABSTRACT

A charge pumping circuit comprises: a charging pump capacitance; a charging unit; a discharging unit; a detection resistor having one terminal and the other terminal, the one terminal being connected between a first node and a second node in a second mode; a voltage source for supplying a reference voltage to the other terminal of the detection resistor; a correction unit for correcting a charging current output from the charging unit and a discharging current that is to be sunk by the discharging unit to equalize the charging current and the discharging current in the second mode, based on a difference between a voltage of the one terminal of the detection resistor and the reference voltage when the charging unit outputs the charging current to the one terminal of the detection resistor and the discharging unit sinks the discharging current from the one terminal of the detection resistor.

3 Claims, 12 Drawing Sheets

F I G. 3
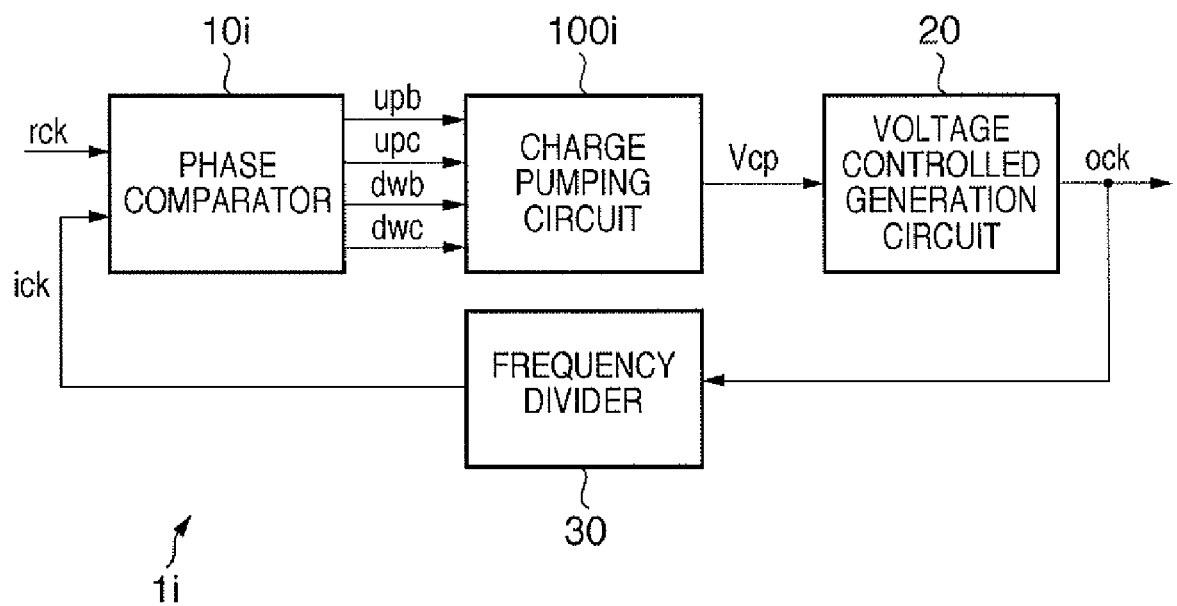

F I G. 12
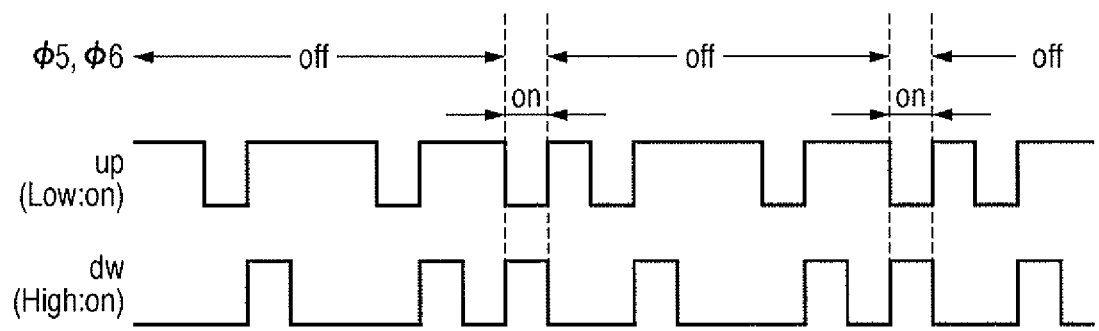

CHARGE PUMPING CIRCUIT AND CLOCK GENERATOR

BACKGROUND OF THE INVENTION

1. Field of the Invention

The present invention relates to a charge pumping circuit and a clock generator.

2. Description of the Related Art

A recent information recording apparatus for data write/readout to/from a recording medium such as an optical disk (e.g., CD-R or DVD-R/RW) obtains the rotation sync signal of the recording medium and extracts a synchronous clock based on it. The information recording apparatus uses the clock as a recording clock in data recording processing. A PLL (Phase Locked Loop) circuit is generally used to extract such periodic clock. When write-accessing a recording medium, a DLL (Delay Locked Loop) circuit is used to control the pulse timing position of a recording pulse based on a predetermined recording strategy of the recording medium. The PLL circuit or DLL circuit commonly uses a charge pumping circuit.

A general charge pumping circuit charges or discharges a charging pump capacitance. The charging is controlled based on a charging current value and the length of on-state time while a charging control switch for controlling the charging time of the charging pump capacitance is on. The discharging is controlled based on a discharging current value and the length of on-state time while a discharging control switch for controlling the discharging time of the charging pump capacitance is on. A PLL circuit controls the length of the on-state time of the charging control switch and the length of the on-state time of the discharging control switch, based on the phase difference and/or the frequency difference between an externally supplied external clock and a clock based on an internal clock output from a voltage controlling generation circuit. A DLL circuit controls them based on the phase difference between an external clock and a desired tap clock. When the charging amount to the charging pump capacitance is equivalent to the discharging amount from the charging pump capacitance, a control voltage that is generated by the charging pump capacitance and that is supplied to the voltage controlling generation circuit become stabilized.

When the charging current value is equivalent to the discharging current value, the length of on-state time during while the charging control switch for controlling the charging time of the charging pump capacitance is on become equivalent to the length of on-state time while the discharging control switch for controlling the discharging time of the charging pump capacitance is on. This allows precise control of the operation timing of the PLL circuit or DLL circuit.

However, if the charging current value and the discharging current value have a difference, and an operation is performed to equalize the charging amount and the discharging amount, a time lag corresponding to the current difference is generated between the length of on-state time while the charging control switch is on and the length of on-state time while the discharging control switch is on. This time lag results in a shift from the ideal operation timing of the PLL circuit or DLL circuit. The time lag in the charge pumping circuit causes instability in the synchronous clock based on the rotation sync signal of a recording medium such as an optical disk. Additionally, the mark length or edge position of a recording mark recorded on the recording medium goes outside the adequate range. This degrades information reproduction quality causing such effects as a jitter characteristic upon reproduction.

FIG. 1 of Japanese Patent Laid-Open No. 2000-224034 illustrates a charge pump 10 which decreases a control voltage to a VCO by outputting a current to an active filter 17 or increases the control voltage to the VCO by sinking a current from the active filter 17. In the charge pump 10, an operational amplifier OP1 acts to equalize a voltage V2 of the common node between a switch S1 and a switch S2 and a voltage V1 of the noninverting input terminal of the operational amplifier OP1. In the charge pump 10, a feedback loop which passes through transistors Q6 and Q4 acts to equalize a voltage V3 of the noninverting input terminal of an operational amplifier OP2 and the voltage V1 of the noninverting input terminal of the operational amplifier OP2. This control achieves V3=V2=V1 so that the voltage V1 of a bias power supply 171 fixes the collector voltages of transistors Q2 and Q4. At this time, since the input impedance of the operational amplifier OP2 is high, a current i4 flowing to the transistor Q4 is nearly equal to a current i2 flowing to the transistor Q2.

Japanese Patent Laid-Open No. 2000-224034 describes that, when W1 denotes the area ratio of the transistors Q4 and Q5, a current i5 flowing to the transistor Q5 is W1 times the current i4 flowing to the transistor Q4. Japanese Patent Laid-Open No. 2000-224034 also describes that, when W1 denotes the area ratio of the transistors Q2 and Q3, a current i3 flowing to the transistor Q3 is W1 times the current i2 flowing to the transistor Q2. That is, according to Japanese Patent Laid-Open No. 2000-224034, since a relation "i3=i2×W1=i4×W1=i5" is achieved, it therefore should be possible to guarantee i3=i5, that is, equalize the value of the output current and that of the sink current in association with the voltage V1.

However, the area ratio of the transistors Q4 and Q5 may differ greatly from that of the transistors Q2 and Q3 because of variations in the manufacturing process of the transistors Q2 to Q5. In this case, since the ratio of i3 to i2 is greatly different from the ratio of i5 to i4 (the above-described relation is not achieved), it is difficult to guarantee that the output and sink currents having the same value.

FIG. 3 of Japanese Patent Laid-Open No. 2006-270225 illustrates a charge pumping circuit 6 which outputs, from an output node N11, a charging current to charge a capacitance C1 of an LPF 8 or flows, from the output node N11 to the Vss side, a discharging current to discharge the capacitance C1 of the LPF 8. A correction charging pump current ΔIpch to equalize the charging current and the discharging current flows to the charge pumping circuit 6 in accordance with a comparison amplification signal supplied from a charge pumping correction circuit 9.

Japanese Patent Laid-Open No. 2006-270225 describes that the charge pumping correction circuit 9 includes a Pch MOS transistor PT1a whose gate has a gate size (gate length or gate width) K times that of a Pch MOS transistor PT1 for generating the charging current. A bias circuit 7 supplies the same bias voltage Vp to the gate of the Pch MOS transistor PT1 and that of the Pch MOS transistor PT1a. This prior art document also describes that the charge pumping correction circuit 9 includes an Nch MOS transistor NT2a whose gate has a gate size (gate length or gate width) K times that of an Nch MOS transistor NT2 for generating the discharging current. The bias circuit 7 supplies the same bias voltage Vn to the gate of the Nch MOS transistor NT2 and that of the Nch MOS transistor NT2a. The charge pumping correction circuit 9 generates the comparison amplification signal and supplies it to the charge pumping circuit 6 to equalize a first current flowing to the Pch MOS transistor PT1a and a second current flowing to the Nch MOS transistor NT2a. According to Japanese Patent Laid-Open No. 2006-270225, this can equalize the charging current and the discharging current.

However, the gate size ratio of the MOS transistors PT1 and PT1a may differ greatly from that of the MOS transistors NT2 and NT2a because of variations in the manufacturing process of the MOS transistors PT1, PT1a, NT2, and NT2a. In this case, since the ratio of the charging current to the first current is greatly different from the ratio of the discharging current to the second current, it is difficult to equalize the charging current and the discharging current.

SUMMARY OF THE INVENTION

The present invention provides a new arrangement for performing correction to equalize the charging current and the discharging current of a charging pump capacitance without using a plurality of currents each having a predetermined ratio to a corresponding one of the charging current and the discharging current.

According to the first aspect of the present invention, there is provided a charge pumping circuit having a first mode and a second mode, the first mode being a mode where a control voltage is increased according to a charging control signal received from an external and where the control voltage is decreased according to a discharging control signal received from the external, the second mode being a mode where a correction operation is performed, the charge pumping circuit comprising: a charging pump capacitance for generating the control voltage; a charging unit for outputting a charging current via a first node according to the charging control signal in the first mode so as to charge the charging pump capacitance; a discharging unit for sinking a discharging current via a second node according to the discharging control signal in the first mode so as to discharge the charging pump capacitance; a detection resistor having one terminal and the other terminal, the one terminal being connected between the first node and the second node in the second mode; a voltage source for supplying a reference voltage to the other terminal of the detection resistor; a correction unit for correcting the charging current output from the charging unit and the discharging current that is to be sunk by the discharging unit to equalize the charging current and the discharging current in the second mode, based on a difference between a voltage of the one terminal of the detection resistor and the reference voltage when the charging unit outputs the charging current to the one terminal of the detection resistor and the discharging unit sinks the discharging current from the one terminal of the detection resistor.

According to the second aspect of the present invention, there is provided a charge pumping circuit having a first mode and a second mode, the first mode being a mode where a control voltage is increased according to a charging control signal received from an external and where the control voltage is decreased according to a discharging control signal received from the external, the second mode being a mode where a correction operation is performed, the charge pumping circuit comprising: a charging pump capacitance for generating the control voltage; a charging unit for outputting a charging current via a first node according to the charging control signal in the first mode so as to charge the charging pump capacitance; a discharging unit for sinking discharging current via a second node according to the discharging control signal in the first mode so as to discharge the charging pump capacitance; a detection capacitance having a first electrode and a second electrode, the first electrode being connected to one of the first node and the second node and the second electrode receiving a reference voltage in the second mode; a setting switch for setting a voltage of the first electrode of the detection capacitance; a voltage source for supplying a reference voltage to the first electrode of the detection capacitance when the setting switch is on; and a correction unit for correcting the charging current output from the charging unit and the discharging current that is to be sunk by the discharging unit to equalize the charging current and the discharging current in the second mode, based on a difference between a voltage of the first electrode of the detection capacitance and the reference voltage after the setting switch sets the voltage of the first electrode at the reference voltage, and an operation of causing the charging unit to output the charging current to the first electrode and an operation of causing the discharging unit to sink the discharging current from the first electrode are performed for an equivalent time.

According to the third aspect of the present invention, there is provided a charge pumping circuit having a first mode and a second mode, the first mode being a mode where a control voltage is increased according to a charging control signal received from an external and where the control voltage is decreased according to a discharging control signal received from the external, the second mode being a mode where a correction operation is performed, the charge pumping circuit comprising: a charging pump capacitance for generating the control voltage; a charging unit for outputting a charging current via a first node according to the charging control signal in the first mode so as to charge the charging pump capacitance; a discharging unit for sinking a discharging current via a second node according to the discharging control signal in the first mode so as to discharge the charging pump capacitance; a detection resistor having one terminal and the other terminal, the one terminal being connected to the first node and the second node and the other terminal being connected to the charging pump capacitance in the second mode; and a correction unit for correcting the charging current output from the charging unit and the discharging current that is to be sunk by the discharging unit to equalize the charging current and the discharging current in the second mode after the first mode, based on a difference between a voltage of the one terminal of the detection resistor and a voltage of the other terminal when the charging unit outputs the charging current to the one terminal of the detection resistor and the discharging unit sinks the discharging current from the one terminal of the detection resistor.

According to the fourth aspect of the present invention, there is provided a clock generator for generating a clock having a specific phase relationship to an external clock received from an external, comprising: a charge pumping circuit according to the first to third aspect of the invention; a voltage controlled generation circuit for receiving a control voltage from the charge pumping circuit and generating one of a clock having a frequency corresponding to the control voltage and a clock having a delay amount corresponding to the control voltage for the external clock; and a phase comparator for comparing a phase of the external clock with a phase of the clock generated internally and supplying one of a charging control signal and a discharging control signal to the charge pumping circuit in accordance with a result of the comparison.

According to the present invention, it is possible to provide a new arrangement for performing correction to equalize the charging current and the discharging current of a charging pump capacitance without using a plurality of currents each having a predetermined ratio to a corresponding one of the charging current and the discharging current.

Further features of the present invention will become apparent from the following description of exemplary embodiments with reference to the attached drawings.

BRIEF DESCRIPTION OF THE DRAWINGS

FIG. 3 is a block diagram showing the arrangement of a clock generator 1$i$ according to the second embodiment of the present invention;

FIG. 12 is a timing chart showing the operation of a current difference detection circuit 105$p$.

DESCRIPTION OF THE EMBODIMENTS

Figure 1:
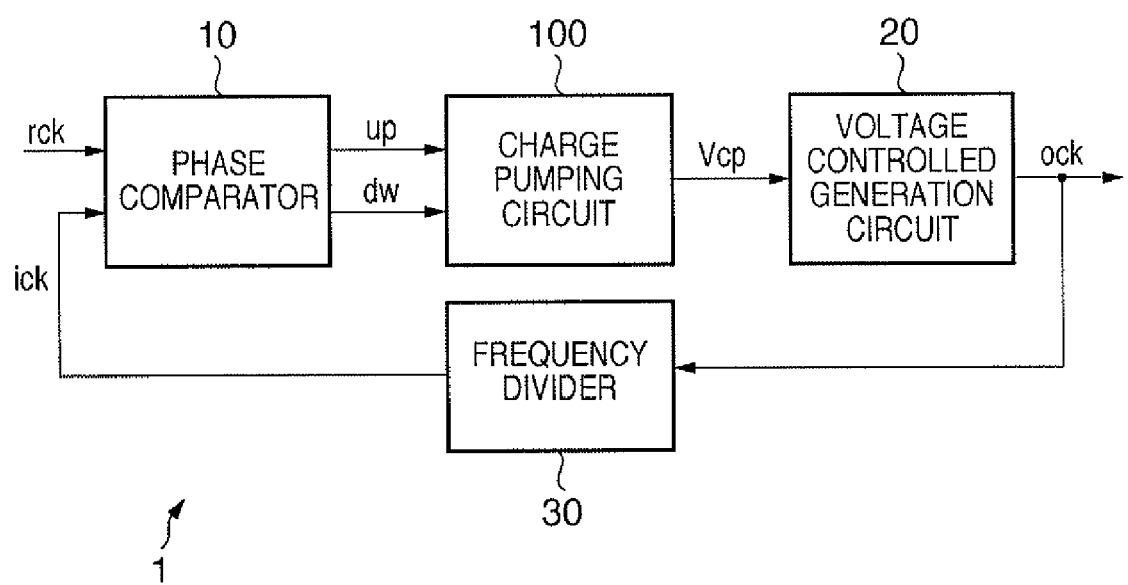
FIG. 1 is a block diagram showing the arrangement of a clock generator 1 according to the first embodiment of the present invention.

A clock generator 1 according to the first embodiment of the present invention will be described with reference to FIG. 1. FIG. 1 is a block diagram showing the arrangement of the clock generator 1 according to the first embodiment of the present invention.

The clock generator 1 generates an internal clock ock having a specific phase relationship to an external clock rck received from an external (an external with regards to the clock generator 1, the external including, for example, an external unit for generating the external clock rck). The clock generator 1 serves as, for example, a PLL (Phase Locked Loop) circuit or a DLL (Delay Locked Loop) circuit.

The clock generator 1 mainly includes a frequency divider 30, a phase comparator 10, a charge pumping circuit 100, and a voltage controlled generation circuit 20.

The frequency divider 30 divides the received internal clock ock to generate a divided clock ick and supplies it to the phase comparator 10. However, the frequency divider 30 is unnecessary if the clock generator serves as a DLL circuit.

The phase comparator 10 receives the external clock rck from the external and the divided clock ick from the frequency divider 30. The phase comparator 10 compares the phase of the external clock rck with that of the divided clock ick. The phase comparator 10 supplies a phase difference signal representing the phase difference between the external clock rck and the divided clock ick to the charge pumping circuit 100 as a result of the comparison. More specifically, the phase comparator 10 supplies, to the charge pumping circuit 100, one of a charging control signal "up" (first phase difference signal) having active level and a discharging control signal "dw" (second phase difference signal) having active level: That is, the phase comparator 10 changes one of the charging control signal "up" and the discharging control signal "dw" to active level depending on whether the divided clock ick has a phase lead or a phase lag with respect to the external clock rck, and supplies the signal having active level to the charge pumping circuit 100.

The charge pumping circuit 100 charges a charging pump capacitance Ccp (to be described later) according to the charging control signal "up" having active level received from the phase comparator 10, thereby increasing a control voltage Vcp. Alternatively, the charge pumping circuit 100, discharges the charging pump capacitance Ccp according to the discharging control signal "dw" having active level received from the phase comparator 10 (an external with regards to the charge pumping circuit 100, i.e. the external including, for example, the phase comparator 10 for generating the charging control signal "up" or the discharging control signal "dw"), thereby decreasing the control voltage Vcp. The charge pumping circuit 100 outputs the increased or decreased control voltage Vcp to the voltage controlled generation circuit 20.

The voltage controlled generation circuit 20 receives the control voltage Vcp from the charge pumping circuit 100 and generates the internal clock ock having a frequency corresponding to the control voltage Vcp or the internal clock ock having a delay amount corresponding to the control voltage Vcp for the external clock rck. The voltage controlled generation circuit 20 serves as, for example, a voltage controlled oscillation circuit (VCO) in a PLL circuit or a voltage controlled delay circuit in a DLL circuit. The voltage controlled generation circuit 20 outputs the generated internal clock ock to an external and also supplies it to the frequency divider 30.

Figure 2:
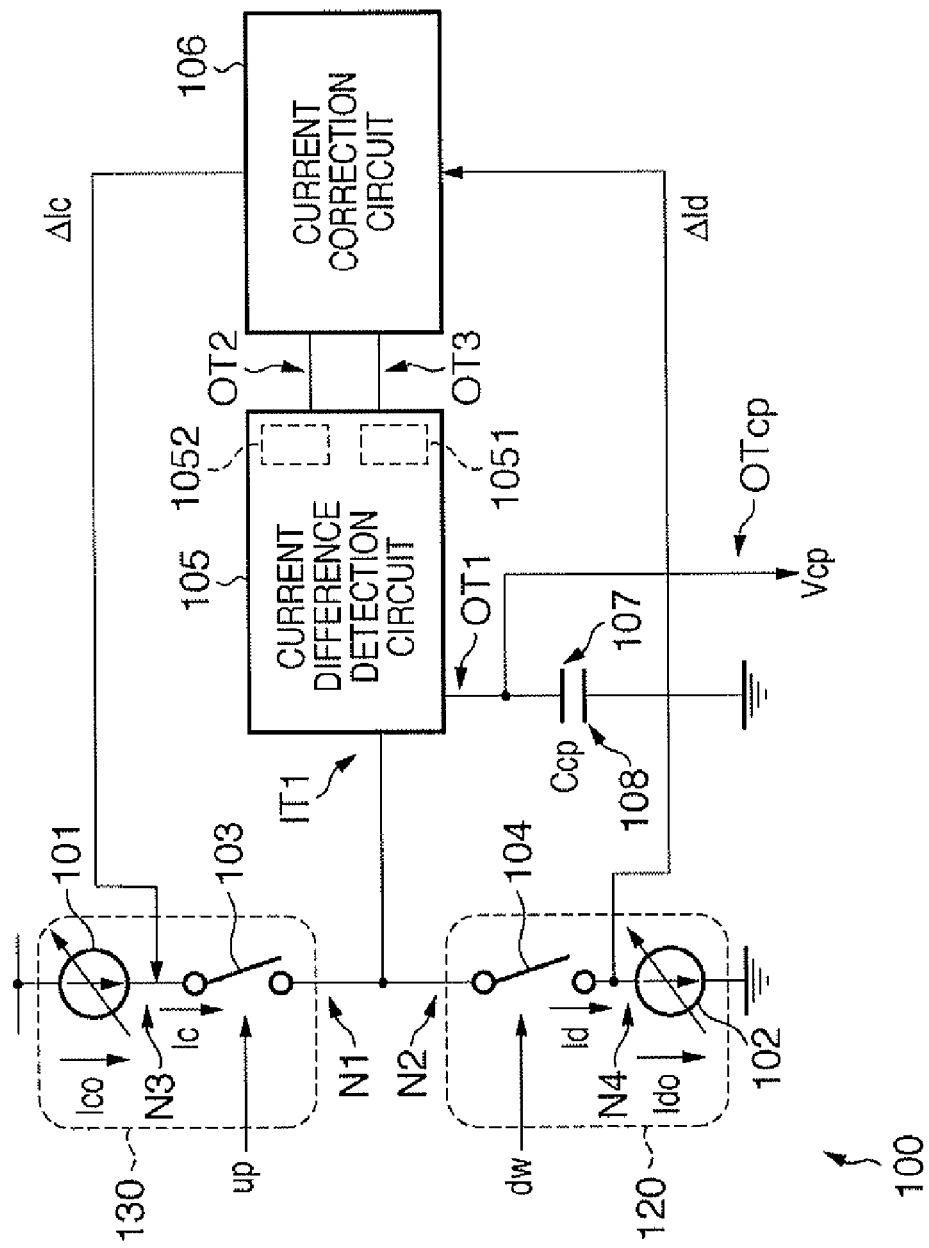
FIG. 2 is a block diagram showing the arrangement of a charge pumping circuit 100 according to the first embodiment of the present invention.

The arrangement of the charge pumping circuit 100 according to the first embodiment of the present invention will be described with reference to FIG. 2. FIG. 2 is a block diagram showing the arrangement of the charge pumping circuit 100 according to the first embodiment of the present invention.

The charge pumping circuit 100 has a first mode and a second mode. In the first mode, the control voltage Vcp is increased or decreased. In the second mode, a correction operation is performed.

The charge pumping circuit 100 includes the charging pump capacitance Ccp, a charging unit 130, a discharging unit 120, a current difference detection circuit 105, and a current correction circuit (correction unit) 106.

In the first mode, the charging pump capacitance Ccp generates the control voltage Vcp. The charging pump capacitance Ccp includes a holding electrode 107 to hold charges and a reference electrode 108 to receive a reference voltage (e.g., ground voltage). The holding electrode 107 is connected to a first output terminal OT1 of the current difference detection circuit 105 and an output terminal OTcp of the charge pumping circuit 100. The charge pumping circuit 100 thus outputs the control voltage Vcp from the output terminal OTcp to the voltage controlled generation circuit 20 (see FIG. 1).

In the first mode, the charging unit 130 receives the charging control signal "up" (first phase difference signal) having active level from the phase comparator 10 and accordingly outputs a charging current Ic via a first node N1 to charge the charging pump capacitance Ccp. The charging unit 130 includes a variable charging current source 101, a charging control switch (first switch) 103, and a third node N3. The variable charging current source 101 outputs a current Ic0 to the third node N3. The charging control switch 103 electrically connects/disconnects the current difference detection circuit 105 to/from the variable charging current source 101. The charging control switch 103 also electrically connects/disconnects the charging pump capacitance Ccp to/from the variable charging current source 101. Upon receiving the charging control signal "up" having active level from the phase comparator 10 (FIG. 1), the charging control switch 103 turns on to connect the variable charging current source 101 to the first node N1. The third node N3 connects the variable charging current source 101 to the charging control switch 103.

In the first mode, the discharging unit 120 receives the discharging control signal "dw" (second phase difference signal) having active level from the phase comparator 10 and accordingly sinks a discharging current Id via a second node N2 to discharge the charging pump capacitance Ccp. The discharging unit 120 includes a variable discharging current source 102, a discharging control switch (second switch) 104, and a fourth node N4. The variable discharging current source 102 sinks a current Id0 from the fourth node N4. The discharging control switch 104 electrically connects/disconnects the current difference detection circuit 105 to/from the variable discharging current source 102. The discharging control switch 104 also electrically connects/disconnects the charging pump capacitance Ccp to/from the variable discharging current source 102. Upon receiving the discharging control signal "dw" having active level from the phase comparator 10 (see FIG. 1), the discharging control switch 104 turns on to connect the variable discharging current source 102 to the second node N2. The fourth node N4 connects the variable discharging current source 102 to the discharging control switch 104.

The current difference detection circuit 105 has an input terminal IT1 connected to the charging control switch 103 and the discharging control switch 104. In the second mode, the current difference detection circuit 105 detects a difference current corresponding to the difference between the charging current Ic and the discharging current Id when both the charging control switch 103 and the discharging control switch 104 are on.

The first output terminal OT1 of the current difference detection circuit 105 is connected to the charging pump capacitance Ccp. In the first mode, when the charging control switch 103 is on, and the discharging control switch 104 is off, the variable charging current Source 101 charges the holding electrode 107 of the charging pump capacitance Ccp via the current difference detection circuit 105. In the first mode, when the charging control switch 103 is off, and the discharging control switch 104 is on, the variable discharging current source 102 discharges the holding electrode 107 of the charging pump capacitance Ccp via the current difference detection circuit 105. In the first mode, these operations are alternately performed to adjust the control voltage Vcp to be generated by the charging pump capacitance Ccp.

In the second mode, the current difference detection circuit 105 detects a difference current corresponding to the difference between the discharging current Id and the charging current Ic. More specifically, the current difference detection circuit 105 includes a detection resistor 1052 and a voltage source 1051. One terminal of the detection resistor 1052 is connected to the first node N1 and the second node N2 in the second mode. In the second mode, a difference current corresponding to the difference between the charging current Ic and the discharging current Id flows across one terminal and the other terminal of the detection resistor 1052. The voltage source 1051 supplies a reference voltage to the other terminal of the detection resistor. In the second mode, the current difference detection circuit 105 supplies the voltage of the one terminal of the detection resistor 1052 to the current correction circuit 106 via the second output terminal OT2 of the current difference detection circuit 105. In the second mode, the current difference detection circuit 105 supplies the reference voltage generated by the voltage source 1051 to the current correction circuit 106 via a third output terminal OT3 of the current difference detection circuit 105. That is, the current difference detection circuit 105 supplies the reference voltage and the voltage of the one terminal of the detection resistor 1052 to the current correction circuit 106 in the second mode.

In the second mode, the current correction circuit 106 performs correction to equalize the current value of the charging current Ic and that of the discharging current Id, based on the difference current detected by the current difference detection circuit 105, that is, based on the reference voltage and the voltage of the one terminal of the detection resistor 1052.

More specifically, in the second mode, the current correction circuit 106 receives the reference voltage and the voltage of the one terminal of the detection resistor 1052 when both of the charging control switch 103 and the discharging control switch 104 are on. That is, in the second mode, the current correction circuit 106 receives the reference voltage and the voltage of the one terminal of the detection resistor 1052 when the charging unit 130 outputs the charging current Ic to the one terminal of the detection resistor 1052, and the discharging unit 120 sinks the discharging current Id from the one terminal of the detection resistor 1052. Based on the difference between the reference voltage and the voltage of the one terminal of the detection resistor 1052, the current correction circuit 106 performs at least one of an operation of outputting a correction current ΔIc to the third node N3 and an operation of sinking a correction current ΔId from the fourth node N4.

For example, if a charging current Ic1 before correction is larger than a discharging current Id1 before correction, a difference current (Ic1-Id1) between the charging current Ic1 and the discharging current Id1 flows from the one terminal to the other terminal of the detection resistor 1052. In this case, letting Vref be the reference voltage supplied to the other terminal of the detection resistor 1052, the voltage of the one terminal of the detection resistor 1052 is given by "Vref+R1×(Ic1-Id1)". The current correction circuit 106 generates a correction current based on the difference between Vref and "Vref+R1×(Ic1-Id1)" of the one terminal of the detection resistor 1052. That is, the current correction circuit 106 outputs the correction current ΔIc (=−(Ic1−Id1)×½) to the third node N3 and sinks the correction current ΔId (=(Ic1−Id1)×½) from the fourth node N4. The charging current to be output from the charging unit 130 is given by $$Ic = Ic1 + \Delta Ic \qquad (1)$$
$$= Ic1 - (Ic1 - Id1) \times 1/2$$
$$= Ic1 \times 1/2 + Id1 \times 1/2$$

The discharging current to be sunk by the discharging unit 120 is given by $$Id = Id1 + \Delta Id \quad (2)$$
$$= Id1 + (Ic1 - Id1) \times 1/2$$
$$= Ic1 \times 1/2 + Id1 \times 1/2$$

As is apparent from Equations (1) and (2), the current values are corrected to

Ic=Id

Alternatively, for example, if a charging current Ic2 before correction is smaller than a discharging current Id2 before correction, a difference current (Id2−Ic2) between the charging current Ic2 and the discharging current Id2 flows from the other terminal to the one terminal of the detection resistor 1052. In this case, letting Vref be the reference voltage supplied to the other terminal of the detection resistor 1052, the voltage of the one terminal of the detection resistor 1052 is given by "Vref−R1×(Id2−Ic2)". The current correction circuit 106 generates a correction current upon receiving Vref and "Vref−R1×(Id2−Ic2)" of the one terminal of the detection resistor 1052. That is, the current correction circuit 106 outputs the correction current ΔIc (=(Id2−Ic2)×½) to the third node N3 and sinks the correction current ΔId (=−(Id2−Ic2)×½) from the fourth node N4. The charging current to be output from the charging unit 130 is given by $$Ic = Ic2 + \Delta Ic \quad (3)$$
$$= Ic2 + (Id2 - Ic2) \times 1/2$$
$$= Ic2 \times 1/2 + Id2 \times 1/2$$

The discharging current to be sunk by the discharging unit 120 is given by $$Id = Id2 + \Delta Id \quad (4)$$
$$= Id2 - (Id2 - Ic2) \times 1/2$$
$$= Ic2 \times 1/2 + Id2 \times 1/2$$

As is apparent from Equations (3) and (4), the current values are corrected to

Ic=Id

In this way, the difference between the charging current and the discharging current is detected by detecting the voltage generated across the detection resistor based on the reference voltage supplied from the voltage source. This obviates a circuit arrangement for generating first and second currents each having a predetermined ratio to a corresponding one of the charging current and the discharging current. It is consequently possible to avoid any degradations in accuracy of detecting the difference between the charging current and the discharging current which are caused by the difference between the ratio of the first current to the charging current and the ratio of the second current to the discharging current because of variations in the manufacturing process. That is, according to this embodiment, it is possible to provide a new arrangement for performing correction to equalize the charging current and the discharging current of a charging pump capacitance without using a plurality of currents each having a predetermined ratio to a corresponding one of the charging current and the discharging current.

The operation of the charge pumping circuit 100 will be explained.

In the charge pumping circuit operation, the charging control switch 103 turns on upon receiving the charging control signal "up" having active level from the phase comparator 10 (FIG. 1). The charging pump capacitance Ccp is thus charged by the charging current Ic output from the charging unit 130. The discharging control switch 104 turns on upon receiving the discharging control signal "dw" having active level from the phase comparator 10 (FIG. 1). The charging pump capacitance Ccp is thus discharged by the discharging current Id sunk by the discharging unit 120. These operations are alternately performed to adjust the control voltage Vcp to be generated by the charging pump capacitance Ccp.

In this embodiment, a current correction period (second mode) to correct the charging current and the discharging current is provided in the charge pumping circuit operation period, thereby correcting the charging current and the discharging current necessary for the charge pumping circuit operation.

In the current correction period (second mode), the charging control signal "up" turns on the charging control switch 103, and simultaneously, the discharging control signal "dw" turns on the discharging control switch 104. The difference current between the charging current output from the charging unit 130 and the discharging current sunk by the discharging unit 120 flows to or from the current difference detection circuit 105.

Alternatively, the time while the charging control switch 103 is kept on by the charging control signal "up" and the time while the discharging control switch 104 is kept on by the discharging control signal "dw" are equalized. At this time, the operation of causing the charging unit 130 to output the charging current to the current difference detection circuit 105 and the operation of causing the discharging unit 120 to sink the discharging current from the current difference detection circuit 105 are performed for an equivalent time.

The current difference detection circuit 105 detects the current difference between the charging current Ic output from the charging unit 130 and the discharging current Id to be sunk by the discharging unit 120, and outputs an output signal (the reference voltage and the voltage of the one terminal of the detection resistor 1052) corresponding to the current difference to the current correction circuit 106. The current correction circuit 106 outputs a current correction signal based on the output signal corresponding to the current difference. More specifically, the current correction circuit 106 performs at least one of the operation of outputting the correction current ΔIc to the third node N3 and the operation of sinking the correction current ΔId from the fourth node N4. In this way, the current correction circuit 106 corrects the current value of the charging current Ic output from the charging unit 130 and that of the discharging current Id sunk by the discharging unit 120 to eliminate the difference between the charging current Ic and the discharging current Id.

During the charge pumping circuit operation period (first mode), the current correction circuit 106 holds the current correction signal set during the current correction period. The current correction circuit 106 continuously performs at least one of the operation of outputting the correction current ΔIc to the third node N3 and the operation of sinking the correction current ΔId from the fourth node N4.

As described above, during the charge pumping circuit operation period (first mode), the control voltage Vcp is adjusted by charging or discharging the charging pump capacitance Ccp. On the other hand, during the current correction period (second mode), the charging control switch 103 and the discharging control switch 104 are on/off-controlled based on the charging control signal "up" and the discharging control signal "dw" which have no correlation with phase information. In this period (second mode), the charging current Ic output from the charging unit 130 and the discharging current Id to be sunk by the discharging unit 120 do not contribute to generation of the control voltage Vcp. Instead, the current difference between them is detected, and current correction is performed to eliminate the current difference. The charge pumping operation during the charge pumping circuit operation period is performed using the charging and discharging currents corrected during the current correction period. Then, the current correction period that does not contribute to generation of the control voltage is provided to perform current correction. Repeating these operations enables the charge pumping circuit operation using the charging current and the discharging current always corrected to eliminate the difference current between them. It is therefore possible to raise the accuracy of the charge pumping circuit operation.

A clock generator $1i$ according to the second embodiment of the present invention will be described with reference to FIG. 3. FIG. 3 is a block diagram showing the arrangement of the clock generator $1i$ according to the second embodiment of the present invention. Points different from the first embodiment will mainly be explained below.

The clock generator $1i$ includes a phase comparator $10i$ and a charge pumping circuit $100i$. The phase comparator $10i$ supplies a first charging control signal upb, a second charging control signal upc, a first discharging control signal dwb, and a second discharging control signal dwc to the charge pumping circuit $100i$.

Figure 4:
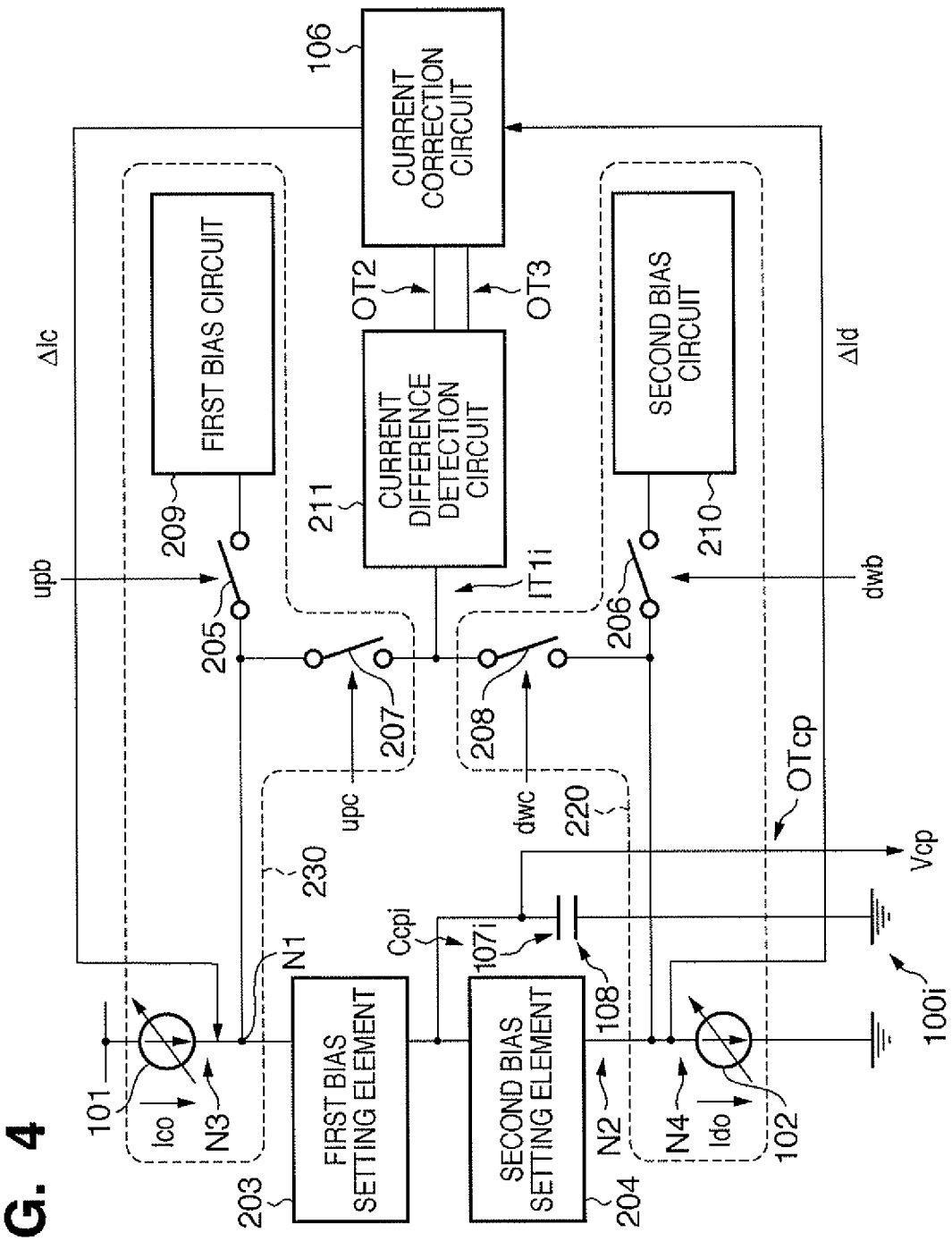
FIG. 4 is a block diagram showing the arrangement of a charge pumping circuit 100$i$ according to the second embodiment of the present invention.

As shown in FIG. 4, the internal arrangement of the charge pumping circuit $100i$ is different from the first embodiment. FIG. 4 is a block diagram showing the arrangement of the charge pumping circuit $100i$ according to the second embodiment of the present invention.

The charge pumping circuit $100i$ includes a charging pump capacitance Ccpi, a charging unit 230, a discharging unit 220, and a first bias setting element 203. The charge pumping circuit $100i$ also includes a second bias setting element 204, and a current difference detection circuit 211.

A holding electrode $107i$ of the charging pump capacitance Ccpi is connected to the first bias setting element 203 and the second bias setting element 204.

The charging unit 230 includes a first charging control switch (third switch) 205, a second charging control switch (first switch) 207, and a first bias circuit 209.

The first charging control switch (third switch) 205 electrically connects/disconnects a variable charging current source 101 to/from the first bias circuit 209. The first charging control switch 205 turns off upon receiving the first charging control signal upb having active level (level to give the instruction for charging), and turns on upon receiving the first charging control signal upb having nonactive level (level to give the instruction for charging stop).

The second charging control switch (first switch) 207 electrically connects/disconnects the current difference detection circuit 211 to/from the variable charging current source 101. The second charging control switch 207 turns on upon receiving the second charging control signal upc having active level (level to give the instruction for detection), and turns off upon receiving the second charging control signal upc having nonactive level (level to give the instruction for detection stop).

The first bias circuit 209 is connected to the first charging control switch 205. When the first charging control switch 205 is on, the first bias circuit 209 sinks a charging current Ic (=Ic0+ΔIc) not to output it to the charging pump capacitance Ccpi. That is, in the first mode, the charging unit 230 outputs the charging current in the off state of the first charging control switch 205, but does not output the charging current in the on state of the first charging control switch 205.

The discharging unit 220 includes a first discharging control switch (fourth switch) 206, a second discharging control switch (second switch) 208, and a second bias circuit 210.

The first discharging control switch (fourth switch) 206 electrically connects/disconnects a variable discharging current source 102 to/from the second bias circuit 2 ten the first discharging control switch 206 turns off upon receiving the first discharging control signal dwb having active level (level to give the instruction for discharging), and turns on upon receiving the first discharging control signal dwb having nonactive level (level to give the instruction for discharging stop).

The second discharging control switch (second switch) 208 electrically connects/disconnects the current difference detection circuit 211 to/from the variable discharging current source 102. The second discharging control switch 208 turns on upon receiving the second discharging control signal dwc having active level (level to give the instruction for detection), and turns off upon receiving the second discharging control signal dwc having nonactive level (level to give the instruction for detection stop).

The second bias circuit 210 is connected to the first discharging control switch 206. When the first discharging control switch 206 is on, the second bias circuit 210 outputs a discharging current Id (=Id0+ΔId) not to sink it from the charging pump capacitance Ccpi.

The first bias setting element 203 suppresses abrupt variations in the charging current Ic output from the charging unit 230. The first bias setting element 203 is connected between the charging unit 230 and the charging pump capacitance Ccpi.

The second bias setting element 204 suppresses abrupt variations in the discharging current Id to be sunk by the discharging unit 220. The second bias setting element 204 is connected between the charging pump capacitance Ccpi and the discharging unit 220.

The current difference detection circuit 211 has an input terminal $IT1i$ connected to the second charging control switch 207 and the second discharging control switch 208. The current difference detection circuit 211 detects a difference current when both the second charging control switch 207 and the second discharging control switch 208 are on, and both the first charging control switch 205 and the first discharging control switch 206 are off. Note that the current difference detection circuit 211 includes no first output terminal OT1 (FIG. 2).

The operation of the charge pumping circuit $100i$ is different from the first embodiment in the following points.

In the charge pumping circuit operation (first mode), the phase comparator $10i$ (FIG. 3) supplies the second charging control signal upc having nonactive level to the second charging control switch 207. The phase comparator $10i$ (FIG. 3) also supplies the second discharging control signal dwc having nonactive level to the second discharging control switch 208. Hence, both the second charging control switch 207 and the second discharging control switch 208 are off. The phase comparator $10i$ (FIG. 3) also supplies the first charging control signal upb having nonactive level to the first charging control switch 205.

Upon receiving the first charging control signal upb having active level (level to give the instruction for charging) from the phase comparator $10i$ (FIG. 3), the first charging control switch 205 turns off. The charging unit 230 outputs the charging current Ic to the charging pump capacitance Ccpi via the first bias setting element 203. That is, the charging pump capacitance Ccpi is charged when the second charging control switch 207 and the second discharging control switch 208 are off, the first charging control switch 205 is off, and the first discharging control switch 206 is on.

Upon receiving the first discharging control signal dwb having active level (level to give the instruction for discharging) from the phase comparator 10*i* (FIG. 3), the first discharging control switch 206 turns off. The discharging unit 220 sinks the discharging current Id from the charging pump capacitance Ccpi via the second bias setting element 204. That is, the charging pump capacitance Ccpi is discharged when the second charging control switch 207 and the second discharging control switch 208 are off, the first charging control switch 205 is on, and the first discharging control switch 206 is off.

In the current correction operation (second mode), the phase comparator 10*i* (FIG. 3) supplies the first charging control signal upb having active level to the first charging control switch 205. The phase comparator 10*i* (FIG. 3) also supplies the first discharging control signal dwb having active level to the first discharging control switch 206. Hence, both the first charging control switch 205 and the first discharging control switch 206 are off.

The phase comparator 10*i* (FIG. 3) also supplies the second charging control signal upc having active level to the second charging control switch 207. The phase comparator 10*i* (FIG. 3) also supplies the second discharging control signal dwc having active level to the second discharging control switch 208. Hence, both the second charging control switch 207 and the second discharging control switch 208 are on. The current difference detection circuit 211 detects the difference current when both the second charging control switch 207 and the second discharging control switch 208 are on, and the first charging control switch 205 and the first discharging control switch 206 are off.

Figure 5:
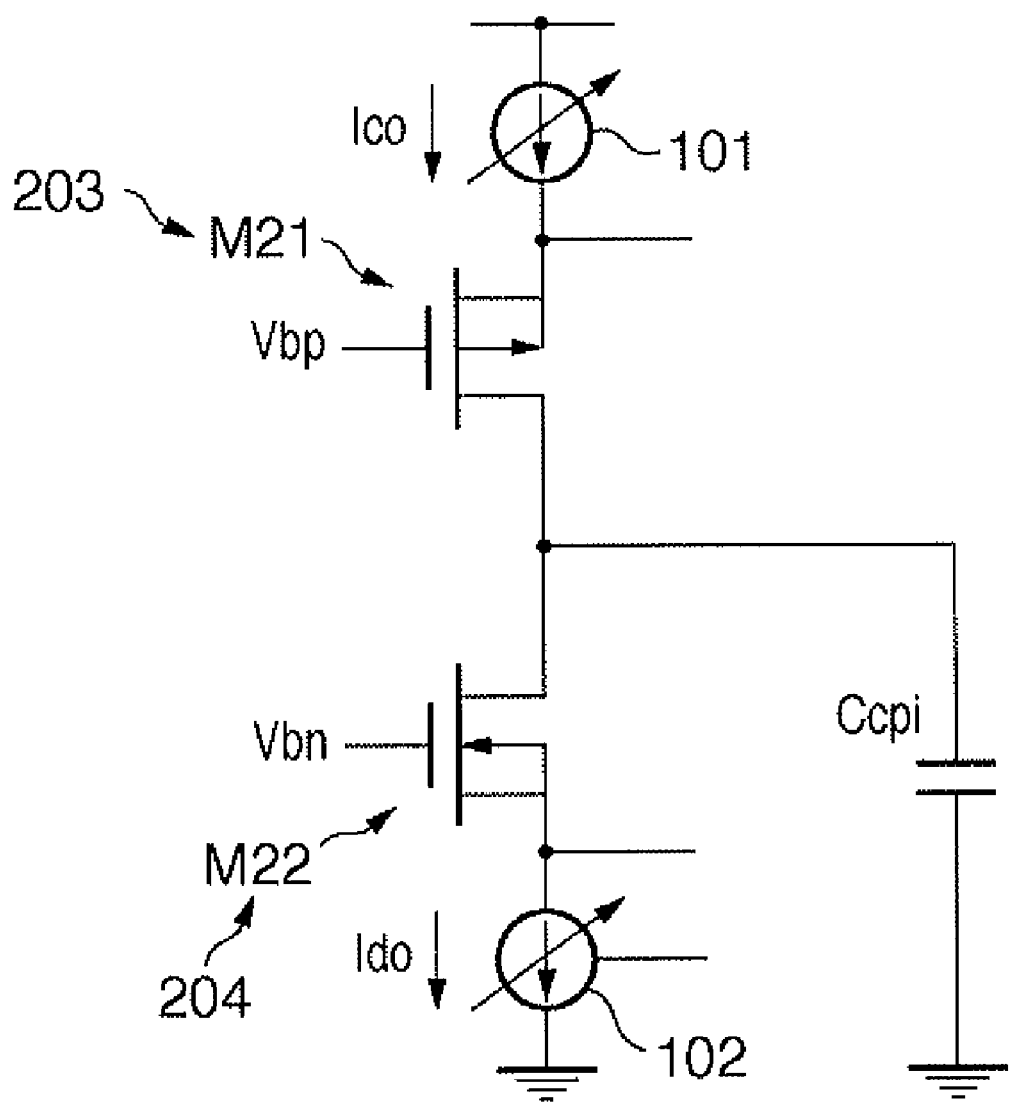
FIG. 5 is a circuit diagram showing the arrangement of a first bias setting element 203 and a second bias setting element 204.

The arrangement of the first bias setting element 203 and the second bias setting element 204 will be described in more detail with reference to FIG. 5. FIG. 5 is a circuit diagram showing the arrangement of the first bias setting element 203 and the second bias setting element 204.

The first bias setting element 203 includes a second PMOS transistor M21 which is of a gate-common type. The second PMOS transistor M21 has a source connected to the variable charging current source 101, a drain connected to the charging pump capacitance Ccpi, and a gate connected to a first bias voltage Vbp. Hence, the drain-to-source voltage of the second PMOS transistor M21 can be constant. This enables to generate the charging current Ic that is not affected by the voltage value of a control voltage Vcp.

The second bias setting element 204 includes a second NMOS transistor M22 which is of a gate-common type. The second NMOS transistor M22 has a source connected to the variable discharging current source 102, a drain connected to the charging pump capacitance Ccpi, and a gate connected to a second bias voltage Vbn. Hence, the drain-to-source voltage of the second NMOS transistor M22 can be constant. This enables to generate the discharging current Id that is not affected by the voltage value of the control voltage Vcp.

Figure 6:
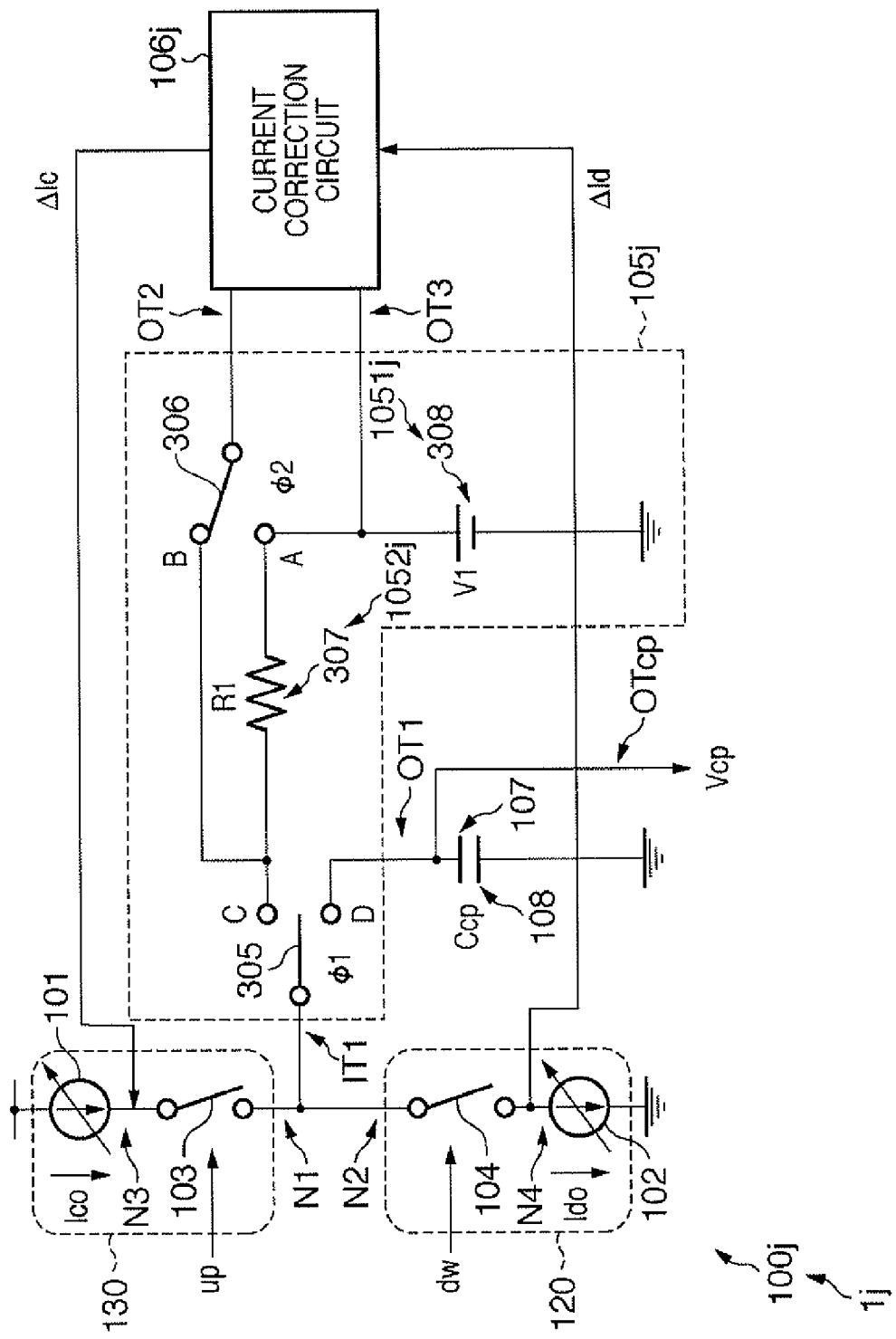
FIG. 6 is a block diagram showing the arrangement of a charge pumping circuit 100$j$ according to the third embodiment of the present invention.

A charge pumping circuit 100*j* of a clock generator 1*j* according to the third embodiment of the present invention will be described with reference to FIG. 6. FIG. 6 is a block diagram showing the arrangement of the charge pumping circuit 100*j* according to the third embodiment of the present invention. Points different from the first embodiment will mainly be explained below.

The charge pumping circuit 100*j* includes a current difference detection circuit 105*j* and a current correction circuit 106*j*.

The current difference detection circuit 105*j* includes a voltage source 1051*j*, a detection resistor 1052*j*, a first switch 305, and a second switch 306.

The voltage source 1051*j* includes a constant voltage source 308. The constant voltage source 308 supplies a first reference voltage V1 to the other terminal (terminal A) of a difference current detection resistor 307. The constant voltage source 308 also outputs the first reference voltage V1 to the current correction circuit 106*j* via the third output terminal OT3.

The detection resistor 1052*j* includes the difference current detection resistor 307. A difference current corresponding to the difference between the charging current and the discharging current flows between one terminal (terminal C) and the other terminal (terminal A) of the difference current detection resistor 307. The difference current detection resistor 307 has a resistance value R1. Hence, a voltage having a voltage difference corresponding to the difference current with respect to the reference voltage is generated at the one terminal of the difference current detection resistor 307.

The first switch 305 electrically connects/disconnects an input terminal IT1 of the current difference detection circuit 105*j* to/from the terminal C or a terminal D. According to a control signal φ1, the first switch 305 switches between a state in which the input terminal IT1 is connected to the terminal C and a state in which the input terminal IT1 is connected to the terminal D. The difference current detection resistor 307 is connected to the terminal C. A charging pump capacitance Ccp is connected to the terminal D.

The second switch 306 electrically connects/disconnects the terminal A or a terminal B to/from a second output terminal OT2 of the current difference detection circuit 105*j*. According to a control signal φ2, the second switch 306 switches between a state in which the terminal A is connected to the second output terminal OT2 and a state in which the terminal B is connected to the second output terminal OT2. The constant voltage source 308 and the third output terminal OT3 of the current difference detection circuit 105*j* are connected to the terminal A. The one terminal (terminal C) of the difference current detection resistor 307 is connected to the terminal B. The second switch 306 connects the terminal B to the second output terminal OT2, thereby outputting the voltage of the one terminal (terminal C) of the difference current detection resistor 307 to the current correction circuit 106*j* via the second output terminal OT2. The voltage of the other terminal (terminal A) of the difference current detection resistor 307 is output to the current correction circuit 106*j* via the third output terminal OT3.

The current difference detection circuit 105*j* thus detects the voltage difference between the one terminal (terminal C) and the other terminal (terminal A) of the difference current detection resistor 307, thereby detecting the difference current between the charging current and the discharging current.

Figure 7:
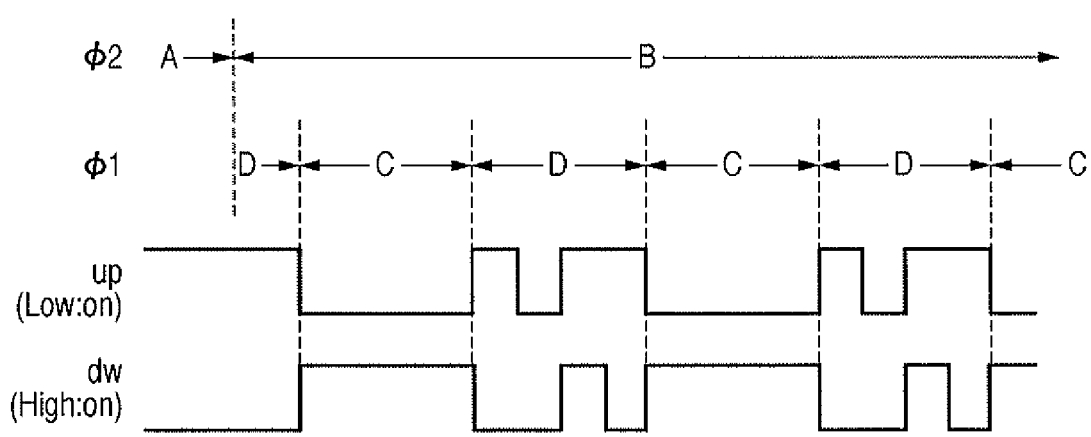
FIG. 7 is a timing chart showing the operation of a current difference detection circuit 105$j$.

The operation of the current difference detection circuit 105*j* will be described next with reference to FIG. 7. FIG. 7 is a timing chart showing the operation of the current difference detection circuit 105*j*. FIG. 7 illustrates a charging control signal "up" as an active low signal and a discharging control signal "dw" as an active high signal.

In the charge pumping circuit operation (first mode), the first switch 305 connects the input terminal IT1 to the terminal D. The period of this operation is a period where the control signal φ1 is indicated by "D" in FIG. 7. At this time, the second switch 306 connects the terminal B to the second output terminal OT2. The period of this operation is a period where the control signal φ2 is indicated by "B" in FIG. 7.

During the period of the charge pumping circuit operation (first mode), the charging control signal "up" and the discharging control signal "dw" are selectively set at active level. During the period when the charging control signal "up" is set at active level, the charging pump capacitance Ccp is charged. During the period when the discharging control signal "dw" is set at active level, the charging pump capacitance Ccp is discharged.

In the current correction operation (second mode), the first switch 305 connects the input terminal IT1 to the terminal C. The period of this operation is a period where the control signal φ1 is indicated by "C" in FIG. 7. At this time, the second switch 306 connects the terminal B to the second output terminal OT2. The period of this operation is a period where the control signal φ2 is indicated by "B" in FIG. 7.

During the period of the current correction operation (second mode), the charging control signal "up" and the discharging control signal "dw" are simultaneously set at active level. Hence, the difference current between the charging current and the discharging current flows to or from the current difference detection circuit 105j.

If a charging current Ic output from a charging unit 130 and a discharging current Id to be sunk by a discharging unit 120 have no difference, the discharging unit 120 properly completely sinks the charging current Ic output from the charging unit 130. For this reason, no current flows to or from the difference current detection resistor 307, and no voltage difference is generated across the difference current detection resistor 307.

If the discharging current Id sunk by the discharging unit 120 is larger than the charging current Ic output from the charging unit 130, the charging current Ic output from the charging unit 130 is short for the discharging current Id to be sunk by the discharging unit 120. For this reason, a current to compensate for the shortage is output from the constant voltage source 308 via the difference current detection resistor 307. At this time, the voltage of the terminal C between the difference current detection resistor 307 and the first switch 305 becomes lower than that of the terminal A between the difference current detection resistor 307 and the constant voltage source 308 by the voltage amount (voltage difference) corresponding to the difference current. The voltage across the difference current detection resistor 307 having the voltage difference is output to the second output terminal OT2 and the third output terminal OT3.

In this case, the current correction circuit 106j receives the output signals from the second output terminal and the third output terminal of the current difference detection circuit 105j and determines that the discharging current Id sunk by the discharging unit 120 is larger than the charging current Ic output from the charging unit 130. As a result, the current correction circuit 106j performs an operation of increasing the charging current Ic output from the charging unit 130 and decreasing the discharging current Id to be sunk by the discharging unit 120.

If the discharging current Id sunk by the discharging unit 120 is smaller than the charging current Ic output from the charging unit 130, the charging current Ic output from the charging unit 130 suffices for the discharging current Id to be sunk by the discharging unit 120 and also generates an excess current. For this reason, the excess current is output to the constant voltage source 308 via the difference current detection resistor 307. The voltage of the terminal C between the difference current detection resistor 307 and the first switch 305 becomes higher than that of the terminal A between the difference current detection resistor 307 and the constant voltage source 308.

In this case, the current correction circuit 106j determines that the discharging current Id sunk by the discharging unit 120 is smaller than the charging current Ic output from the charging unit 130. The current correction circuit 106j performs an operation of decreasing the charging current Ic output from the charging unit 130 and increasing the discharging current Id to be sunk by the discharging unit 120.

In this way, the current correction circuit 106j outputs a current correction signal based on the difference current signal output from the current difference detection circuit 105j, and performs correction to eliminate the difference between the charging current Ic output from the charging unit 130 and the discharging current Id to be sunk by the discharging unit 120.

Figure 8:
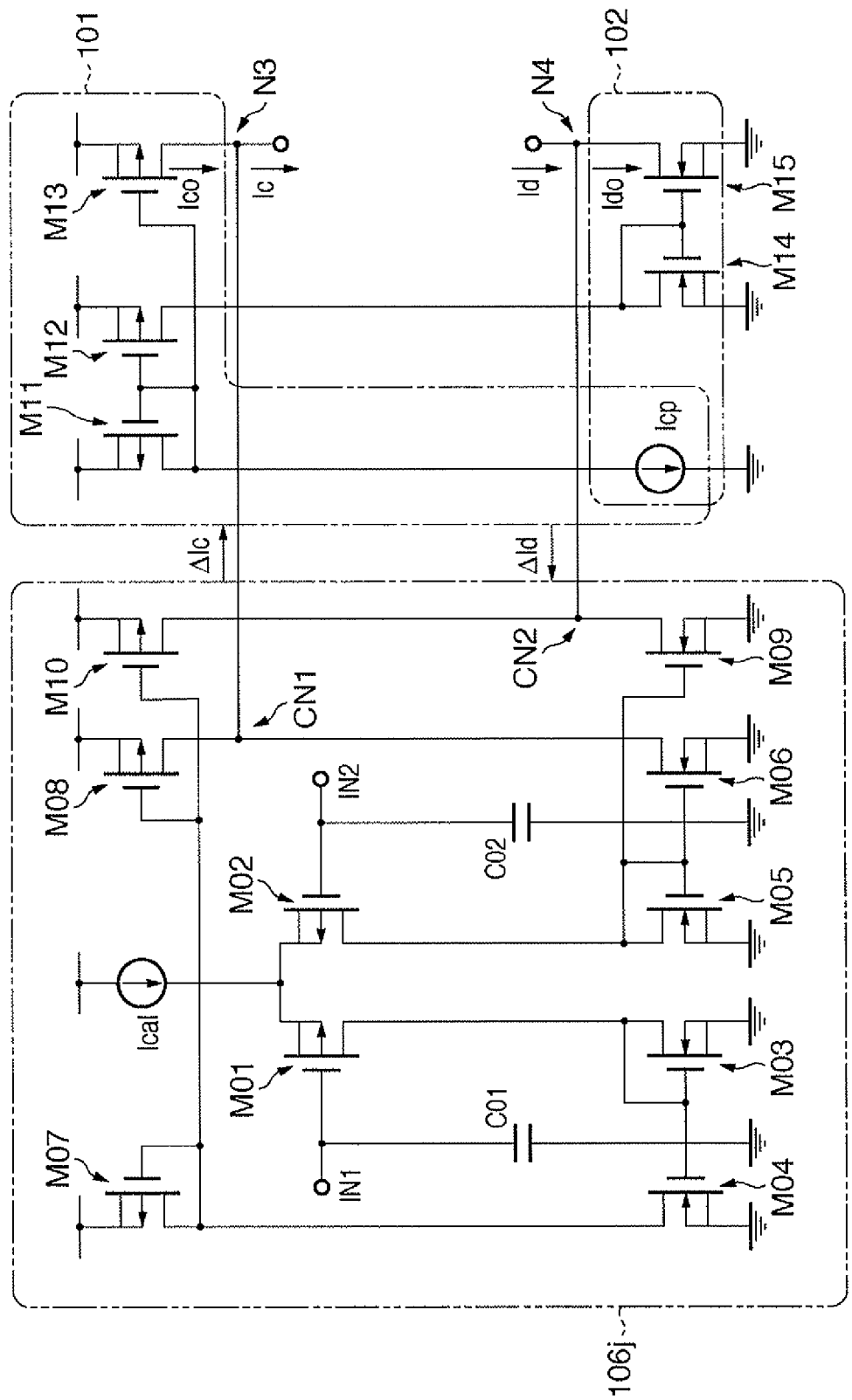
FIG. 8 is a circuit diagram showing the arrangement of a current correction circuit 106$j$ according to the third embodiment of the present invention.

In addition, the current correction circuit 106j generates correction currents ΔIc and ΔId by an arrangement shown in FIG. 8. FIG. 8 is a circuit diagram showing the arrangement of the current correction circuit 106j according to the third embodiment of the present invention.

An input terminal IN1 of the current correction circuit 106j receives a signal output from the second output terminal OT2 of the current difference detection circuit 105j (the voltage of the one terminal (terminal C) of the difference current detection resistor 307). The input terminal IN1 is connected to the gate of a PMOS transistor M01 and a GND voltage referenced holding capacitance C01.

An input terminal IN2 of the current correction circuit 106j receives a signal output from the third output terminal OT3 of the current difference detection circuit 105j (the voltage of the other terminal (terminal A) of the difference current detection resistor 307). The input terminal IN2 is connected to the gate of a PMOS transistor M02 and a GND voltage referenced holding capacitance C02.

The PMOS transistors M01 and M02 form a differential pair. A constant current source Ica1 for generating a correction current is connected to the sources of the PMOS transistors M01 and M02.

The gate and drain of an NMOS transistor M03 are connected to the drain of the PMOS transistor M01. The gate of an NMOS transistor M04 is connected to the gate and drain of the NMOS transistor M03 to form a current mirror circuit.

The gate and drain of an NMOS transistor M05 are connected to the drain of the PMOS transistor M02. The gates of NMOS transistors M06 and M09 are connected to the gate and drain of the NMOS transistor M05 to form a current mirror circuit.

The gate and drain of a PMOS transistor M07 are connected to the drain of the PMOS transistor M04. The gates of PMOS transistors M08 and M10 are connected to the gate and drain of the PMOS transistor M07 to form a current mirror circuit.

The drain of the NMOS transistor M06 is connected to the drain of the PMOS transistor M08. The drain of the NMOS transistor M09 is connected to the drain of the PMOS transistor M10.

The gate and drain of a PMOS transistor M11 are connected to a constant current source Icp which serves as the basic current source of the charging pump current flowing into the GND voltage. The gates of PMOS transistors M12 and M13 are connected to the gate and drain of the PMOS transistor M11 to form a current mirror circuit.

The gate and drain of an NMOS transistor M14 are connected to the drain of the PMOS transistor M12. The gate of an NMOS transistor M15 is connected to the gate and drain of the NMOS transistor M14 to form a current mirror circuit.

The drain of the PMOS transistor M13, that is, a third node N3 is connected to a node CN1 between the drain of the PMOS transistor M08 and that of the NMOS transistor M06. The correction current ΔIc output from the node CN1 to the third node N3 and a current Ic0 output from the PMOS transistor M13 to the third node N3 correspond to the charging current Ic output from the charging unit 130.

The drain of the NMOS transistor M15, that is, a fourth node N4 is connected to a node CN2 between the drain of the PMOS transistor M10 and that of the NMOS transistor M09. The correction current ΔId to be sunk, from the fourth node N4, by the node CN2 and a current Id0 to be sunk, from the fourth node N4, by the NMOS transistor M15 correspond to the discharging current Id sunk by the discharging unit 120.

The transistors M01 to M10 function as the current correction circuit 106j. The constant current source Icp and the transistors M11 to M13 function as a variable charging current source 101. The constant current source Icp and the transistors M14 and M15 function as a variable discharging current source 102.

The operation of the circuit shown in FIG. 8 will be described.

For example, if the input terminals IN1 and IN2 of the current correction circuit 106j have an equipotential, ½ the current value of the constant current source Ica1 flows to the drains of the PMOS transistors M01 and M02. These currents are turned by the corresponding current mirrors. This equalizes the current value output from the drain of the PMOS transistor M08 and the current value output to the drain of the NMOS transistor M06. This also equalizes the current value output from the drain of the PMOS transistor M10 and the current value output to the drain of the NMOS transistor M09. Hence, the current from the constant current source Ica1 does not contribute to the currents of the variable charging current source 101 and the variable discharging current source 102. Both the current Ic0 output from the variable charging current source 101 and the current Id0 sunk by the variable discharging current source 102 equal "Icp". That is, ideally, Ic0=Id0=Icp. In fact, however, the current Ic0 output from the variable charging current source 101 and the current Id0 output from the variable discharging current source 102 are sometimes different.

For example, consider a case in which the current Id0 sunk by the variable discharging current source 102 is larger than the current Ic0 output from the variable charging current source 101. Assume that the charging unit 130 outputs only the current Ic0 as the charging current Ic, and the discharging unit 120 sinks only the current Id0 as the discharging current Id. In this case, the charging current output from the charging unit 130 is short for the discharging current to be sunk by the discharging unit 120. For this reason, a current to compensate for the shortage is output from the constant voltage source 308 (FIG. 6) via the difference current detection resistor 307. At this time, the voltage of the terminal C between the difference current detection resistor 307 and the first switch 305 becomes lower than that of the terminal A between the difference current detection resistor 307 and the constant voltage source 308. The potential of the input terminal IN1 of the current correction circuit 106j becomes lower than that of the input terminal IN2.

A current larger than ½ the current value of the constant current source Ica1 flows to the PMOS transistor M01, and a current smaller than ½ the current value of the constant current source Ica1 flows to the PMOS transistor M02. Let ΔIca1 be the variable current value. A current "0.5×Ica1+ΔIca1" flows to the PMOS transistor M01, and a current "0.5×Ica1−ΔIca1" flows to the PMOS transistor M02.

Hence, the node CN1 between the drain of the PMOS transistor M08 and that of the NMOS transistor M06 outputs a current "2×ΔIca1" as the correction current ΔIc. The value of the charging current output from the charging unit 130 is "IC0+2×ΔIca1".

Similarly, the node CN2 between the drain of the PMOS transistor M10 and that of the NMOS transistor M09 sinks a current "−2×ΔIca1" as the correction current ΔId. The value of the discharging current to be sunk by the discharging unit 120 is "Id0−2×ΔIca1".

In this way, the variable current value ΔIca1 is adjusted in accordance with the potential of the input terminal IN1 of the current correction circuit 106j, which is lower than that of the input terminal IN2. This enables feedback to equalize the charging current output from the charging unit 130 and the discharging current to be sunk by the discharging unit 120.

For example, consider a case in which the current Id0 sunk by the variable discharging current source 102 is smaller than the current Ic0 output from the variable charging current source 101. Assume that the charging unit 130 outputs only the current Ic0 as the charging current Ic, and the discharging unit 120 sinks only the current Id0 as the discharging current Id. In this case, the charging current output from the charging unit 130 suffices for the discharging current to be sunk by the discharging unit 120 and also generates an excess current. For this reason, the excess current is output to the constant voltage source 308 via the difference current detection resistor 307. The voltage of the terminal C between the difference current detection resistor 307 and the first switch 305 becomes higher than that of the terminal A between the difference current detection resistor 307 and the constant voltage source 308.

At this time, a current "0.5×Ica1−ΔIca1" flows to the PMOS transistor M01, and a current "0.5×Ica1+ΔIca1" flows to the PMOS transistor M02.

Hence, the node CN1 between the drain of the PMOS transistor M08 and that of the NMOS transistor M06 outputs a current "−2×ΔIca1" as the correction current ΔIc. The value of the charging current output from the charging unit 130 is "Ic0−2×ΔIca1".

Similarly, the node CN2 between the drain of the PMOS transistor M10 and that of the NMOS transistor M09 sinks a current "2×ΔIca1" as the correction current ΔId. The value of the discharging current to be sunk by the discharging unit 120 is "Id0+2×ΔIca1".

In this way, the variable current value ΔIca1 is adjusted in accordance with the potential of the input terminal IN2 of the current correction circuit 106j, which is lower than that of the input terminal IN1. This enables feedback to equalize the charging current output from the charging unit 130 and the discharging current to be sunk by the discharging unit 120.

During the charge pumping circuit operation period, the following operation is performed. The GND voltage referenced holding capacitance C01 connected to the input terminal IN1, and the GND voltage referenced holding capacitance C02 connected to the input terminal IN2 hold the potential of each output terminal of the current difference detection circuit 105j during the current correction period. The correction current value by the current correction circuit 106j is thus held during the charge pumping circuit operation period.

Note that this current difference detection circuit is also applicable as the current difference detection circuit of the second embodiment by keeping the first switch 305 connected to the terminal C.

As described above, during the current correction-period, the current difference detection circuit of this embodiment detects the difference current between the charging current and the discharging current, thereby enabling the charge pumping circuit operation without the difference current between the charging current and the discharging current.

Figure 9:
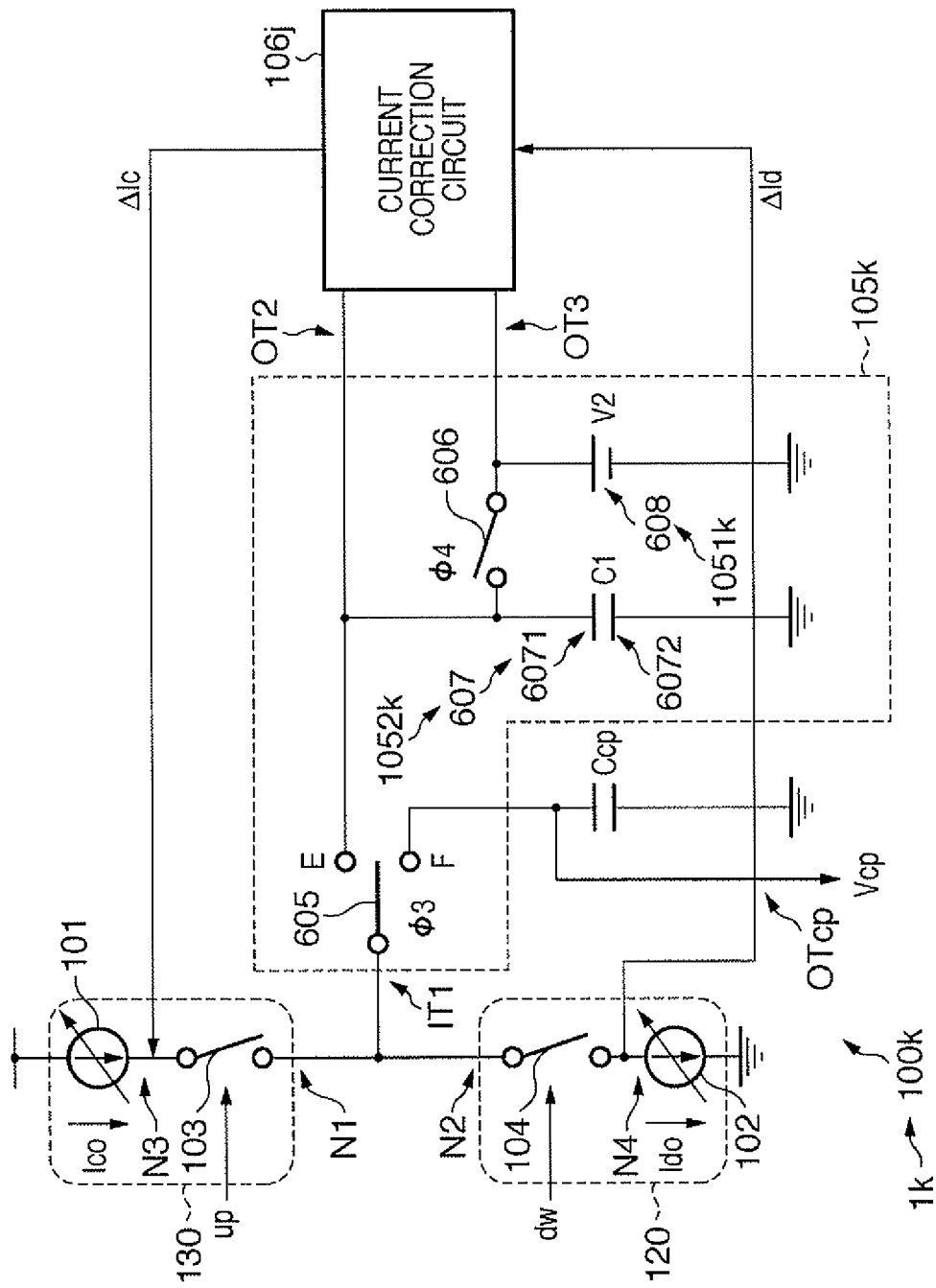
FIG. 9 is a block diagram showing the arrangement of a charge pumping circuit 100$k$ according to the fourth embodiment of the present invention.

A charge pumping circuit 100k of a clock generator 1k according to the fourth embodiment of the present invention will be described with reference to FIG. 9. FIG. 9 is a block diagram showing the arrangement of the charge pumping circuit 100k according to the fourth embodiment of the present invention. Points different from the first embodiment will mainly be explained below.

A current difference detection circuit 105k includes a voltage source 1051k, a detection capacitance 1052k, a first switch 605, and a second switch (setting switch) 606.

The voltage source 1051k includes a second constant voltage source 608. In the second mode, the second constant voltage source 608 supplies a second reference voltage V2 to a first electrode 6071 of a difference current detection capacitance 607 when the second switch (setting switch) 606 is on. The second constant voltage source 608 also supplies the second reference voltage V2 to a current correction circuit 106j via a third output terminal OT3.

The detection capacitance 1052k includes the difference current detection capacitance 607. The difference current detection capacitance 607 includes the first electrode 6071 and a second electrode 6072. In the second mode, the first electrode 6071 is connected to a first node N1 or a second node N2. Hence, in the second mode, a difference current corresponding to the difference between the charging current and the discharging current equivalently flows to or from the first electrode 6071. A reference voltage (e.g., ground voltage) is supplied to the second electrode 6072. The difference current detection capacitance 607 has a capacitance value C1.

The first switch 605 electrically connects/disconnects an input terminal IT1 of the current difference detection circuit 105k to/from a terminal E or a terminal F. According to a control signal φ3, the first switch 605 switches between a state in which the input terminal IT1 is connected to the terminal E in the second mode and a state in which the input terminal IT1 is connected to the terminal F in the first mode. The terminal E is connected to the first electrode 6071 of the difference current detection capacitance 607 and a second output terminal OT2 of the difference current detection circuit 105k. The terminal F is connected to the charging pump capacitance Ccp and the output terminal OTcp of the charge pumping circuit 100k.

The second switch 606 electrically connects/disconnects the first electrode 6071 of the difference current detection capacitance 607 to/from the second constant voltage source 608. The second switch 606 turns on according to a control signal φ4 to set the voltage of the first electrode 6071 of the difference current detection capacitance 607 to the second reference voltage V2. The second switch 606 then turns off. In this case, when the difference current flows to or from the first electrode 6071 of the difference current detection capacitance 607, the first electrode 6071 has a voltage having a voltage difference corresponding to the difference current with respect to the second reference voltage V2. This voltage is output to the current correction circuit 106j via the second output terminal OT2.

In this way, the second switch 606 sets the voltage of the first electrode 6071 to the second reference voltage V2 in the second mode. After that, the on operation of the first switch 605 and that of the second switch 606 are performed for an equivalent time. More specifically, an operation of causing a charging unit 130 to output a charging current Ic to the first electrode 6071 and an operation of causing a discharging unit 120 to sink a discharging current Id from the first electrode 6071 are performed for an equivalent time. The difference current detection circuit 105k receives the second reference voltage V2 and the voltage of the first electrode 6071 of the difference current detection capacitance 607 after the charging operation and the discharging operation have been performed for an equivalent time. The current correction circuit 106j thus performs correction to equalize the charging current Ic output from the charging unit 130 and the discharging current Id to be sunk by the discharging unit 120 based on the difference between the second reference voltage V2 and the voltage of the first electrode 6071 of the difference current detection capacitance 607.

Figure 10:
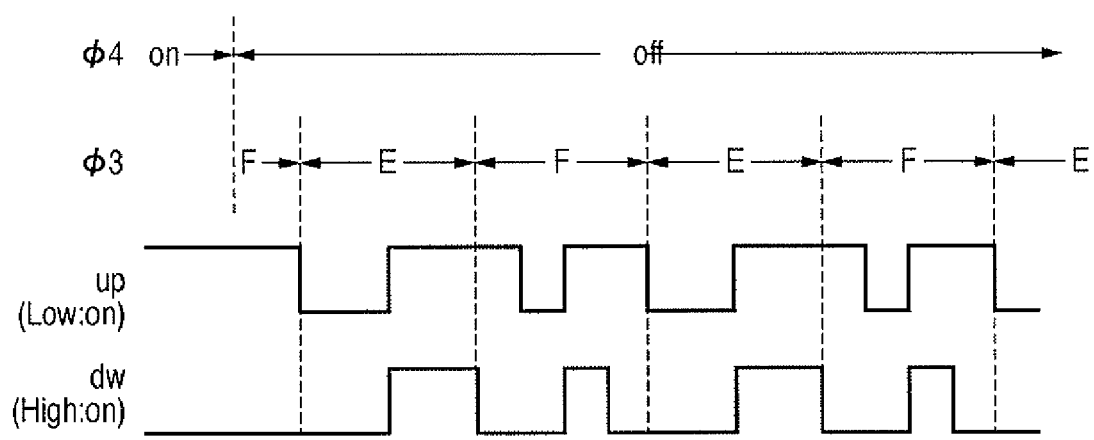
FIG. 10 is a timing chart showing the operation of a current difference detection circuit 105$k$.

The operation of the current difference detection circuit 105k will be described with reference to FIG. 10. FIG. 10 is a timing chart showing the operation of the current difference detection circuit 105k. FIG. 10 illustrates a charging control signal "up" as an active low signal and a discharging control signal "dw" as an active high signal.

In the initial operation, the second switch 606 receives the control signal φ4 having active level and turns on. The second switch 606 thus sets the voltage of the first electrode 6071 of the difference current detection capacitance 607 at the second reference voltage V2. The period of this operation is a period where the control signal φ4 is indicated by "on" in FIG. 10.

In the charge pumping circuit operation (first mode), the first switch 605 connects the input terminal IT1 to the terminal F. The period of this operation is a period where the control signal φ3 is indicated by "F" in FIG. 10. At this time, the second switch 606 is off. The period of this operation is a period where the control signal φ4 is indicated by "off" in FIG. 10.

During the period of the charge pumping circuit operation, the charging control signal "up" and the discharging control signal "dw" are selectively set at active level. During the period when the charging control signal "up" is set at active level, the charging pump capacitance Ccp is charged. During the period when the discharging control signal "dw" is set at active level, the charging pump capacitance Ccp is discharged.

In the current correction operation (second mode), the first switch 605 connects the input terminal IT1 to the terminal E. The period of this operation is a period where the control signal φ3 is indicated by "E" in FIG. 10. At this time, the second switch 606 is off. The period of this operation is a period where the control signal φ4 is indicated by "off" in FIG. 10.

During the period of the current correction operation (second mode), the charging control signal "up" and the discharging control signal "dw" are selectively set at active level for an equivalent time. Hence, charges corresponding to the difference current between the charging current and the discharging current are accumulated in the difference current detection capacitance 607.

More specifically, when a charging control switch 103 turns on, and a discharging control switch 104 turns off, the difference current detection capacitance C1 is charged by the current of a variable charging current source 101. When the charging control switch 103 turns off, and the discharging control switch 104 turns on, the difference current detection capacitance C1 is discharged by the current of a variable discharging current source 102.

Note that the time during which the charging control switch 103 is on and during which the discharging control switch 104 is off may be equalized with the time during which the charging control switch 103 is off and during which the discharging control switch 104 is on, and the operation may be repeated.

For example, if the charging current Ic output from the charging unit 130 and the discharging current Id to be sunk by the discharging unit 120 have no difference, charges supplied from the variable charging current source 101 equal those removed to the variable discharging current source 102. For this reason, the voltage of the first electrode of the difference current detection capacitance C1 is set at the second reference voltage V2.

For example, if the discharging current Id sunk by the discharging unit 120 is larger than the charging current Ic output from the charging unit 130, the charges supplied by the charging current Ic output from the charging unit 130 are short for the charges to be removed by the discharging current Id to be sunk by the discharging unit 120. For this reason, the voltage of the difference current detection capacitance C1 lowers from the initial value V1. The voltage difference between the initial value V1 and the lowered voltage of the difference current detection capacitance C1 is output to the first output terminal and the second output terminal. The current correction circuit 106j receives the output signals from the second output terminal OT2 and the third output terminal OT3 of the current difference detection circuit 105k and determines that the discharging current Id sunk by the discharging unit 120 is larger than the charging current Ic output from the charging unit 130. As a result, the current correction circuit 106j performs a correction operation of increasing the charging current Ic output from the charging unit 130 and decreasing the discharging current Id to be sunk by the discharging unit 120.

For example, consider a case in which the discharging current Id sunk by the discharging unit 120 is smaller than the charging current Ic output from the charging unit 130. In this case, the charges supplied by the charging current Ic output from the charging unit 130 suffice for the charges removed by the discharging current Id to be sunk by the discharging unit 120 and also generate an excess current. For this reason, the voltage of the difference current detection capacitance C1 rises from the second reference voltage V2 that is the initial value. The current correction circuit 106j determines that the discharging current Id sunk by the discharging unit 120 is smaller than the charging current Ic output from the charging unit 130 and performs an operation of decreasing the charging current Ic output from the charging unit 130 and increasing the discharging current Id to be sunk by the discharging unit 120.

Figure 11:
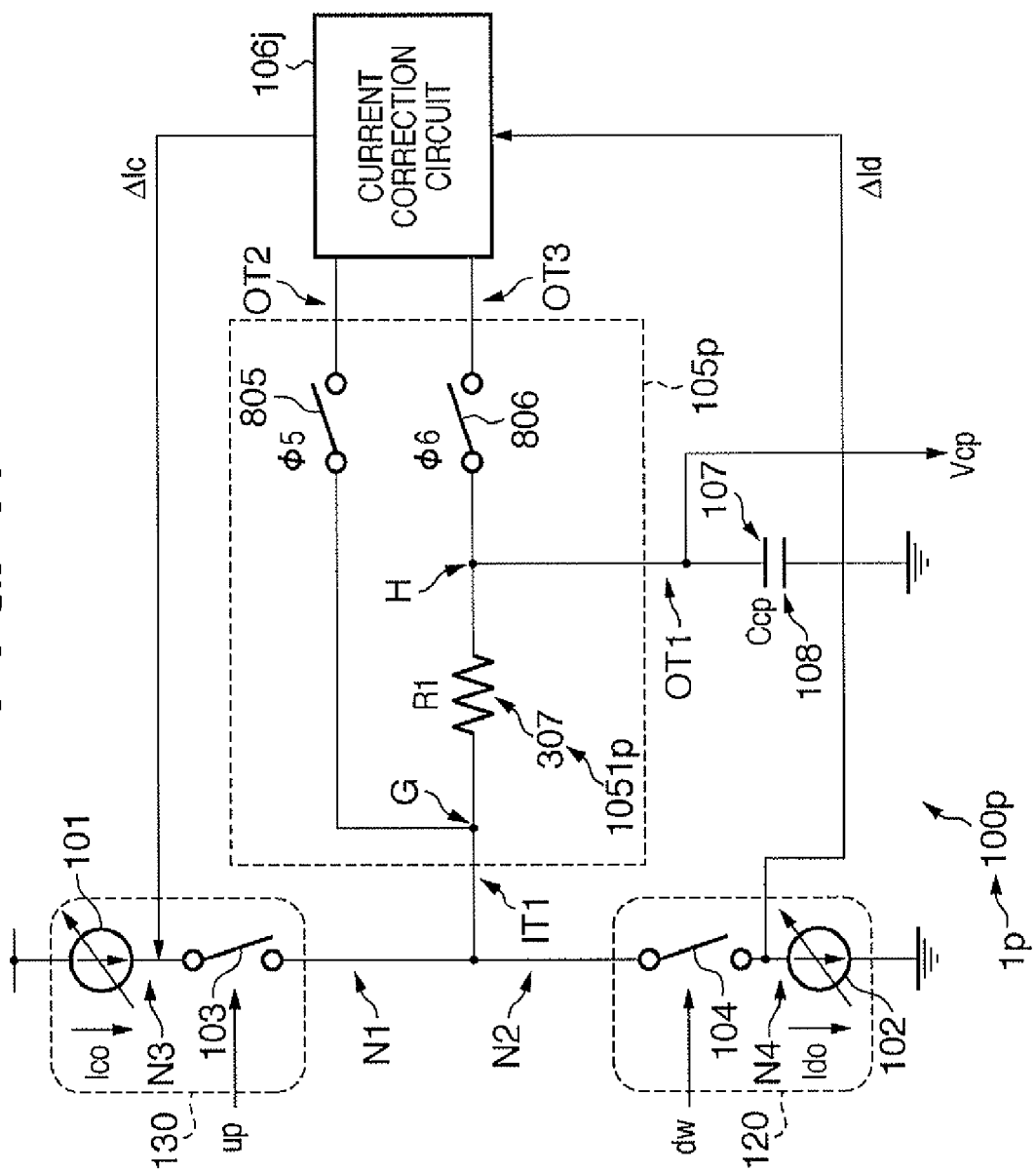
FIG. 11 is a block diagram showing the arrangement of a charge pumping circuit 100$p$ according to the fifth embodiment of the present invention.

A charge pumping circuit 100p of a clock generator 1p according to the fifth embodiment of the present invention will be described with reference to FIG. 11. FIG. 11 is a block diagram showing the arrangement of the charge pumping circuit 100p according to the fifth embodiment of the present invention. Points different from the first and third embodiments will mainly be explained below.

The charge pumping circuit 100p includes a difference current detection circuit 105p.

The current difference detection circuit 105p includes a detection resistor 1051p, a ninth switch 805, and a tenth switch 806. The difference current detection circuit 105p includes no voltage source.

The detection resistor 1051p generates a voltage corresponding to a difference current using, as a reference, the voltage of a holding electrode 107 of a charging pump capacitance Ccp. More specifically, the detection resistor 1051p includes a difference current detection resistor 307. In the second mode, the one terminal of the difference current detection resistor 307 is connected to a first node N1 and a second node N2. In the second mode, a difference current corresponding to the difference between the charging current and the discharging current flows between the one terminal (terminal G) and the other terminal (terminal H) of the difference current detection resistor 307. The difference current detection resistor 307 has a resistance value R1. In the second mode after the first mode, the holding electrode 107 of the charging pump capacitance Ccp supplies the generated control voltage Vcp to the other terminal (terminal H) of the difference current detection resistor 307. Hence, a voltage having a voltage difference corresponding to the difference current with respect to the control voltage Vcp is generated at one terminal of the difference current detection resistor 307 by the resistance value R1.

The ninth switch 805 electrically connects/disconnects the one terminal (terminal G) of the difference current detection resistor 307 to/from a second output terminal OT2 of the difference current detection circuit 105p. The ninth switch 805 turns on according to a control signal φ5 to supply the voltage of the one terminal (terminal G) of the difference current detection resistor 307 to a current correction circuit 106j via the second output terminal OT2.

The tenth switch 806 electrically connects/disconnects the other terminal (terminal H) of the difference current detection resistor 307 to/from the third output terminal OT3 of the difference current detection circuit 105p. The tenth switch 806 turns on according to a control signal φ6 to supply the voltage of the other terminal (terminal H) of the difference current detection resistor 307, that is, the control voltage Vcp to the current correction circuit 106j via the third output terminal OT3.

The current difference detection circuit 105p thus detects the voltage difference between the one terminal (terminal G) and the other terminal (terminal H) of the difference current detection resistor 307, thereby detecting the difference current between the charging current and the discharging current.

The operation of the current difference detection circuit 105p will be described with reference to FIG. 12. FIG. 12 is a timing chart showing the operation of the current difference detection circuit 105p. FIG. 12 illustrates a charging control signal "up" as an active low signal and a discharging control signal "dw" as an active high signal.

In the charge pumping circuit operation, the ninth switch 805 and the tenth switch 806 turn off to electrically disconnect the one terminal (terminal G) and the other terminal (terminal H) of the difference current detection resistor 307 from the second output terminal OT2 and the third output terminal OT3, respectively. The period of this operation is a period where the control signals φ5 and φ6 are indicated by "off" in FIG. 12.

During the period of the charge pumping circuit operation (first mode), the charging control signal "up" and the discharging control signal "dw" are selectively set at active level. During the period when the charging control signal "up" is set at active level, the charging pump capacitance Ccp is charged. During the period when the discharging control signal "dw" is set at active level, the charging pump capacitance Ccp is discharged.

In the current correction operation (second mode), the ninth switch 805 and the tenth switch 806 turn on to electrically connect the one terminal (terminal G) and the other terminal (terminal H) of the difference current detection resistor 307 to the second output terminal OT2 and the third output terminal OT3, respectively. The period of this operation is a period where the control signals φ5 and φ6 are indicated by "on" in FIG. 12.

During the period of the current correction operation, the charging control signal "up" and the discharging control signal "dw" are simultaneously set at active level. Hence, the difference current between the charging current and the discharging current flows to or from the current difference detection circuit 105*p*.

In the above-described embodiment, the charge pumping circuit operation period and the current correction period are alternately repeated. This enables the charge pumping circuit operation using the charging current and the discharging current always corrected to eliminate the difference current between them. However, the current correction period may be provided, for example, only once at the time of activating the circuit or at every start of the operation from the standby state. The correction current value may be fixed by the current correction signal during the provided current correction period, and after that, only the charge pumping circuit operation period using the fixed current value may continue.

In the above-described embodiment, the current correction circuit corrects both the current value of the charging current and that of the discharging current. However, only the charging current or the discharging current may be corrected to eliminate the difference current between the charging current and the discharging current.

As described above, according to the embodiment, the charge pumping circuit performs current correction using, the charging current and the discharging current to the charging pump capacitance. This makes it possible to equalize the charging current and the discharging current and improve the accuracy.

Note that the above-described embodiments are merely examples of practicing the present invention and should not construe to limit the technical scope of the present invention. That is, various changes and modifications can be made for the present invention without departing from its technical scope and main features.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-272352, filed Oct. 22, 2008, which is hereby incorporated by reference herein in its entirety.

What is claimed is:

1. A charge pumping circuit having a first mode and a second mode, the first mode being a mode where a control voltage is increased according to a charging control signal received from an external and where the control voltage is decreased according to a discharging control signal received from the external, the second mode being a mode where a correction operation is performed, the charge pumping circuit comprising:
   a charging pump capacitance for generating the control voltage;
   a charging unit for outputting a charging current via a first node according to the charging control signal in the first mode so as to charge the charging pump capacitance;
   a discharging unit for sinking a discharging current via a second node according to the discharging control signal in the first mode so as to discharge the charging pump capacitance;
   a detection resistor having one terminal and the other terminal, the one terminal being connected between the first node and the second node in the second mode;
   a voltage source for supplying a reference voltage to the other terminal of the detection resistor;
   a correction unit for correcting the charging current output from the charging unit and the discharging current that is to be sunk by the discharging unit to equalize the charging current and the discharging current in the second mode, based on a difference between a voltage of the one terminal of the detection resistor and the reference voltage when the charging unit outputs the charging current to the one terminal of the detection resistor and the discharging unit sinks the discharging current from the one terminal of the detection resistor.

2. The circuit according to claim 1, wherein
the charging unit comprises:
a charging current source;
a first switch which turns on according to the charging control signal so as to connect the first node to the charging current source; and
a third node for connecting the charging current source to the first switch,
the discharging unit comprises:
a discharging current source;
a second switch which turns on according to the discharging control signal so as to connect the second node to the discharging current source; and
a fourth node for connecting the discharging current source to the second switch,
the correction unit performs at least one of an operation of outputting a correction current to the third node and an operation of sinking a correction current from the fourth node in the second mode, based on the difference between the voltage of the one terminal of the detection resistor and the reference voltage when both the first switch and the second switch are on,
the charging unit outputs, as the charging current, a current output from the charging current source to the third node and the correction current output from the correction unit to the third node in the second mode, and
the discharging unit sinks, as the discharging current, a current that is to be sunk from the fourth node by the discharging current source and the correction current that is to be sunk from the fourth node by the correction unit in the second mode.

3. A clock generator for generating a clock having a specific phase relationship to an external clock received from an external, comprising:
   a charge pumping circuit of claim 1;
   a voltage controlled generation circuit for receiving a control voltage from the charge pumping circuit and generating one of a clock having a frequency corresponding to the control voltage and a clock having a delay amount corresponding to the control voltage for the external clock; and
   a phase comparator for comparing a phase of the external clock with a phase of the clock generated internally and supplying one of a charging control signal and a discharging control signal to the charge pumping circuit in accordance with a result of the comparison.

* * * * *